United States Patent
Ko

(10) Patent No.: US 7,253,110 B2
(45) Date of Patent: Aug. 7, 2007

(54) METHOD AND APPARATUS FOR FORMING A BARRIER METAL LAYER IN SEMICONDUCTOR DEVICES

(75) Inventor: Sangtae Ko, Tokyo (JP)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/701,341

(22) Filed: Nov. 4, 2003

(65) Prior Publication Data

US 2004/0132284 A1   Jul. 8, 2004

(30) Foreign Application Priority Data

Dec. 30, 2002  (KR) .................. 10-2002-0087490

(51) Int. Cl.
*H01L 21/44* (2006.01)
*H01L 21/4763* (2006.01)
*H01L 21/3205* (2006.01)

(52) U.S. Cl. .............. 438/686; 438/687; 438/685; 438/649; 438/653; 438/592; 257/E21.264; 257/E21.576; 257/E21.259; 257/E21.584

(58) Field of Classification Search ................ 438/622, 438/627, 648, 653, 658, 659, 660, 663, 676, 438/680, 681, 685, 913, 686, 687, 649; 257/E21.264, 257/E21.576, E21.584, E21.259
See application file for complete search history.

(56) References Cited

U.S. PATENT DOCUMENTS

| | | | |
|---|---|---|---|
| 5,770,520 A | * | 6/1998 | Zhao et al. .................. 438/653 |
| 6,271,136 B1 | * | 8/2001 | Shue et al. .................. 438/687 |
| 6,355,902 B2 | * | 3/2002 | Akahori et al. ......... 219/121.43 |
| 2001/0012667 A1 | * | 8/2001 | Ma et al. ..................... 438/287 |
| 2003/0073301 A1 | * | 4/2003 | Nguyen et al. ............. 438/618 |

* cited by examiner

*Primary Examiner*—Walter Lindsay, Jr.
(74) *Attorney, Agent, or Firm*—Saliwanchik, Lloyd & Saliwanchik

(57) ABSTRACT

A method and apparatus for forming a barrier metal layer in semiconductor devices are disclosed. A disclosed method for forming a barrier metal layer in a semiconductor device forms an interlayer insulating layer on a front face of a semiconductor substrate having a contact area and patterns the interlayer insulating layer to open the contact area. The disclosed method further places the semiconductor substrate in a chamber, injects reactant gas and precursor into the chamber, transforms the gas into plasma gas and causes the plasma gas to react with the precursor to form a single TiSiN film covering the contact area.

7 Claims, 7 Drawing Sheets

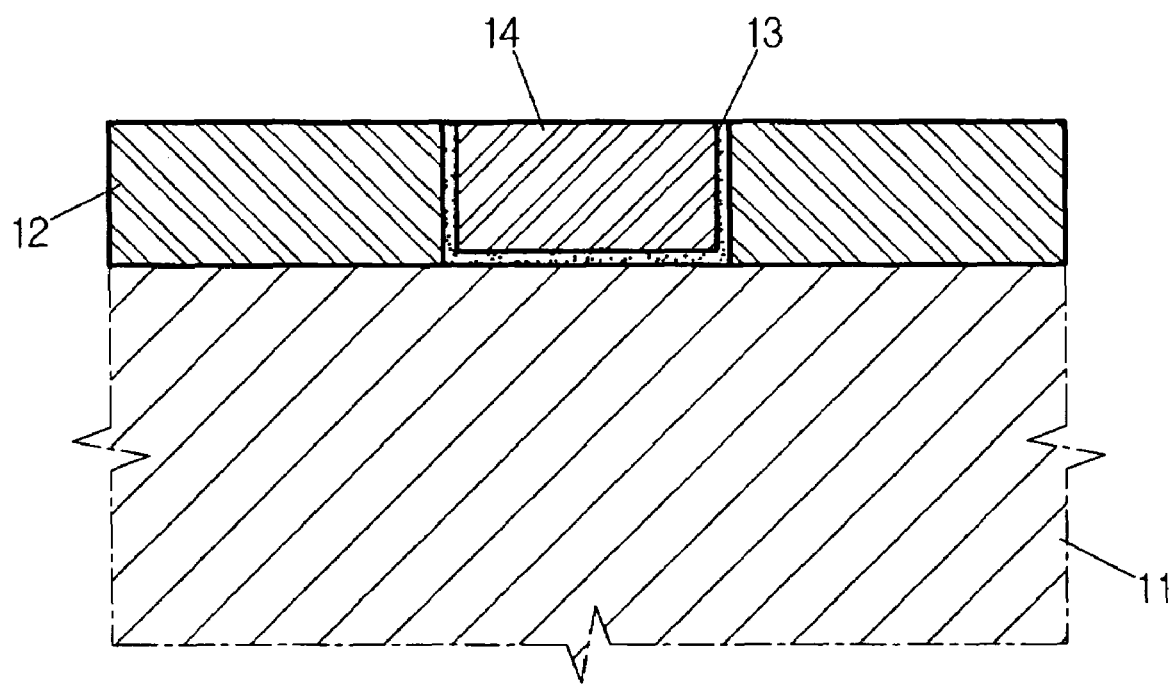

METHOD AND APPARATUS FOR FORMING A BARRIER METAL LAYER IN SEMICONDUCTOR DEVICES

FIELD OF THE DISCLOSURE

The present disclosure relates generally to a method and apparatus for forming a barrier metal layer in semiconductor devices and, more particularly, to a method and apparatus that can form a single layer barrier metal layer as well as lower the specific resistance of the same.

BACKGROUND

Semiconductor devices are typically designed using increasingly smaller sizes or geometries, thereby promoting the importance of wire layers made of Al, Cu, etc. The use of wire layers made of Al, Cu, etc. enhances the importance of barrier metal layers that, for example, prevent diffusion of silicon from a semiconductor substrate, a silicon-containing layer, etc. into a wire layer.

FIGS. 1 and 2 illustrate an example of a known barrier metal layer configuration. The example barrier metal layer configuration shown in FIGS. 1 and 2 is generally fabricated by forming an interlayer insulating layer 2 on a semiconductor substrate 1 having a series of previously formed basic components and then opening a contact hole in a portion of the interlayer insulating layer 2; forming first and second metal base layers 3a and 4a on a front face of the semiconductor substrate 1 containing the contact hole; forming a contact metal base layer 6a on a front face of the first and second metal base layers 3a and 4a to fill the contact hole; and forming a final barrier metal layer 5 and a contact metal layer 6 within the contact hole of the interlayer insulating layer 2 as shown in FIG. 2 via polishing such as chemical mechanical polishing (CMP).

In the known example of FIGS. 1 and 2, the first and second barrier metal layers 3a and 4a are made of various materials such as TiN/Ti, TaN/Ta and WN/W. The barrier metal layers 3a and 4a of the example shown in FIGS. 1 and 2 have a double-layer structure as in TiN/Ti, TaN/Ta and WN/W. Such a double-layer structure is typically used for the barrier metal layers 3a and 4a because using a single-layer structure formed using known barrier metal layers would provide undesirable polishing, barrier and contact characteristics.

Although the polishing, barrier and contact characteristics of the barrier metal layers 3a and 4a can be improved to a certain degree if the barrier metal layers 3a and 4a are formed using a double-layer structure, the overall thicknesses of the combined barrier metal layers 3a and 4a is increased. Of course, if the resistance of the wire layer is increased as a result of the increased thickness of the barrier metal layers 3a and 4a, the quality of a resultant semiconductor device is also significantly decreased. Furthermore, the barrier metal layers 3a and 4a formed using the known double layer structure also increases the number of overall process steps, thereby decreasing the overall productivity of a semiconductor fabrication process.

BRIEF DESCRIPTION OF THE DRAWINGS

FIGS. 5-7 are sectional views illustrating example process steps for forming a single barrier metal layer in a semiconductor device.

DETAILED DESCRIPTION

The example method and apparatus disclosed herein may be used to form a single layer structure of TiSiN to provide a barrier metal layer to reduce the overall thickness of the barrier metal layer and thus prevent unnecessary decrease in the sectional area of a final wire layer, thereby minimizing the wire resistance of the final wire layer.

The examples disclosed herein may be advantageously used to impart a single layer structure to a barrier metal layer to enhance the productivity and quality of a final semiconductor device to at least a predetermined level. More particularly, the examples disclosed herein may utilize an injection of a precursor such as Tetra Di-Ethyl Amido Titanium (TDEAT), Tetra Di-Methyl Amido Titanium (TD-MAT) and reactant gas such as $SiH_4$ and $NH_3$ to form a single barrier metal layer made of TiSiN, while simultaneously transforming the reactant gas into plasma and depositing TiSiN source in corresponding divided sections of a chamber so that unnecessary impurities interfering in a growth procedure of TiSiN are naturally removed and thus the specific resistance of a finally obtained TiSiN film is restricted within a suitable level.

In one example, a method for forming a barrier metal layer in a semiconductor device includes forming an interlayer insulating layer on a front face of a semiconductor substrate having an area which is predetermined as a contact and patterning the interlayer insulating layer to open the contact area; placing the substrate in a chamber, and injecting reactant gas and precursor respectively into the chamber; and transforming the gas into plasma gas and causing the plasma gas to react with the precursor to form a single TiSiN film covering the area predetermined as a contact.

In another example, an apparatus for forming a barrier metal layer in a semiconductor device includes a chamber for defining a process space and having a stage in the process space so that a semiconductor wafer to be processed is seated on the stage; a partition for dividing the process space within the chamber into upper and lower sections; a reactant gas injector for injecting reactant gas into the upper section of the chamber; a precursor injector for injecting precursor into the lower section of the chamber; and an RF antenna for supplying RF power to the upper section of the chamber to transform the reactant gas into plasma, wherein the reactant gas which is transformed into plasma in the upper section is reacted with the precursor in the lower section to deposit a TiSiN film on a desired area of the semiconductor wafer to be processed.

Figure 1:
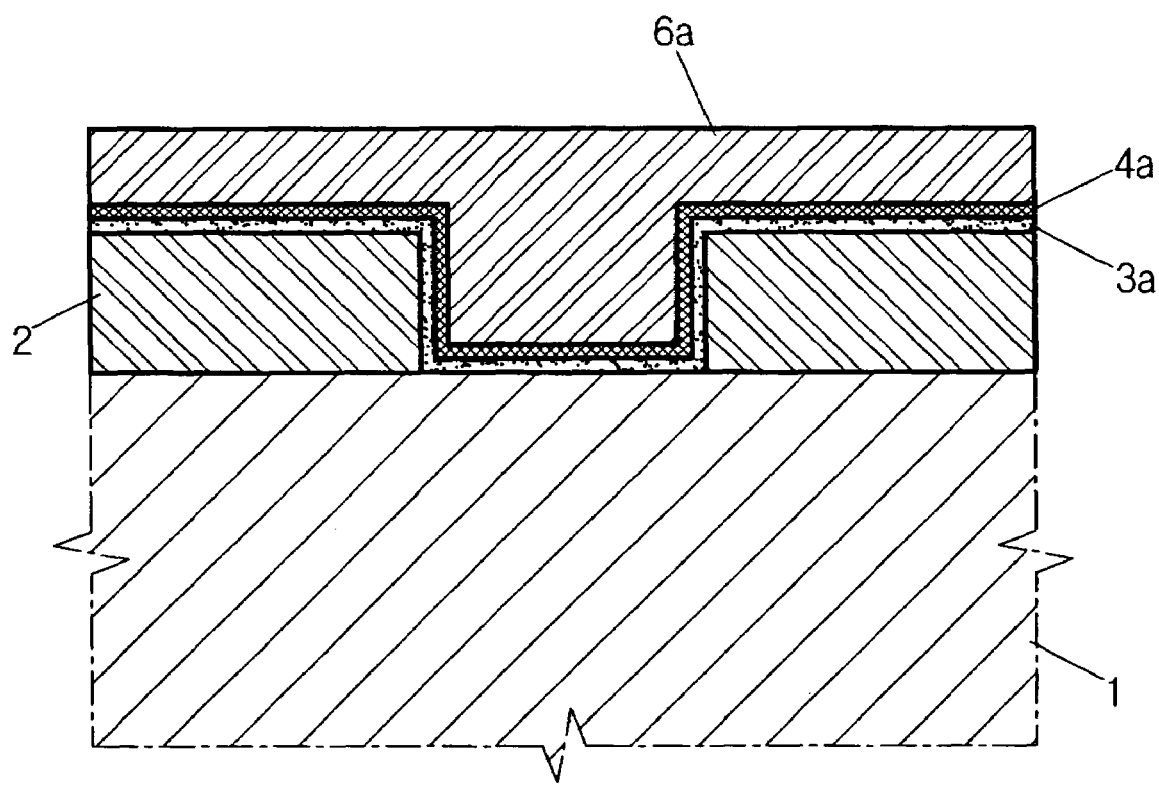
FIGS. 1 and 2 are sectional views illustrating conventional process steps for forming a two layer barrier metal layer in a semiconductor device.
Figure 2:
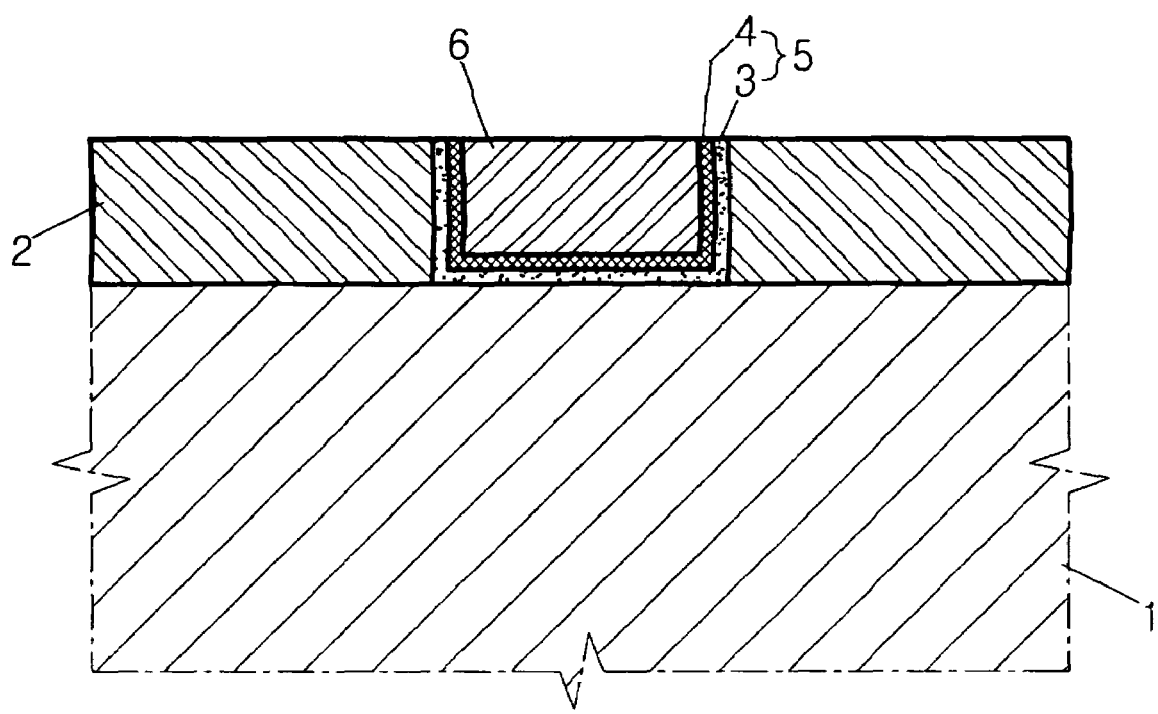
Figure 3:
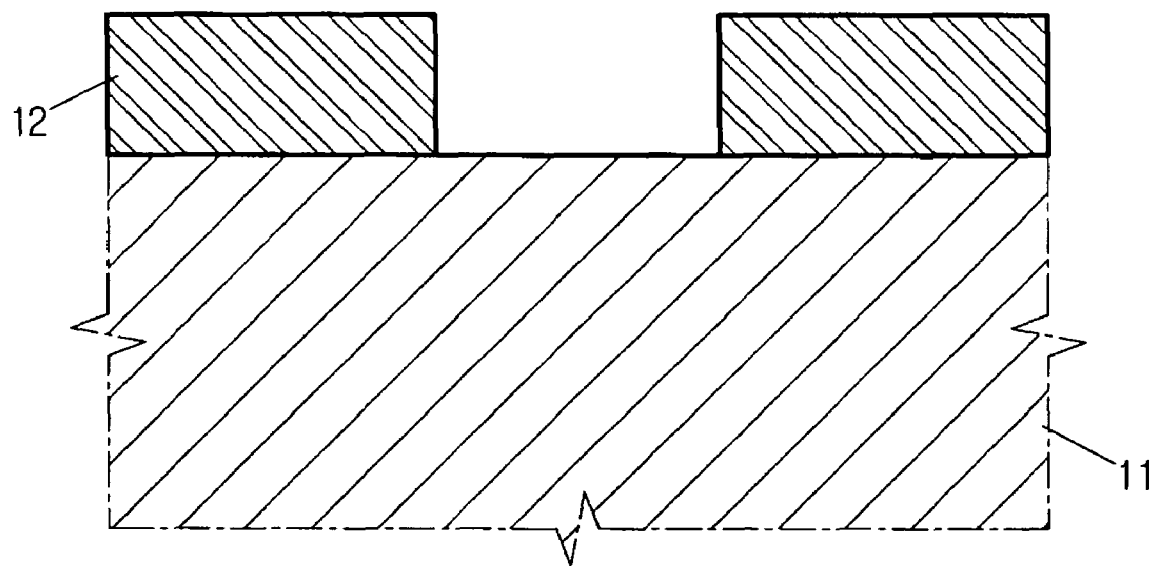
FIG. 3 is a sectional view illustrating an example process step for forming a single layer barrier metal layer in a semiconductor device.

As shown in FIG. 3, an example semiconductor fabrication process proceeds with a series of low pressure chemical vapor deposition processes to form a predetermined thickness of interlayer insulating layer 12 on an upper face of a semiconductor substrate 11, including an area which is predetermined as a contact. The example process then carries out a series of photolithography steps to pattern a corresponding region of the interlayer insulating layer 12 to open the predetermined area.

Figure 4:
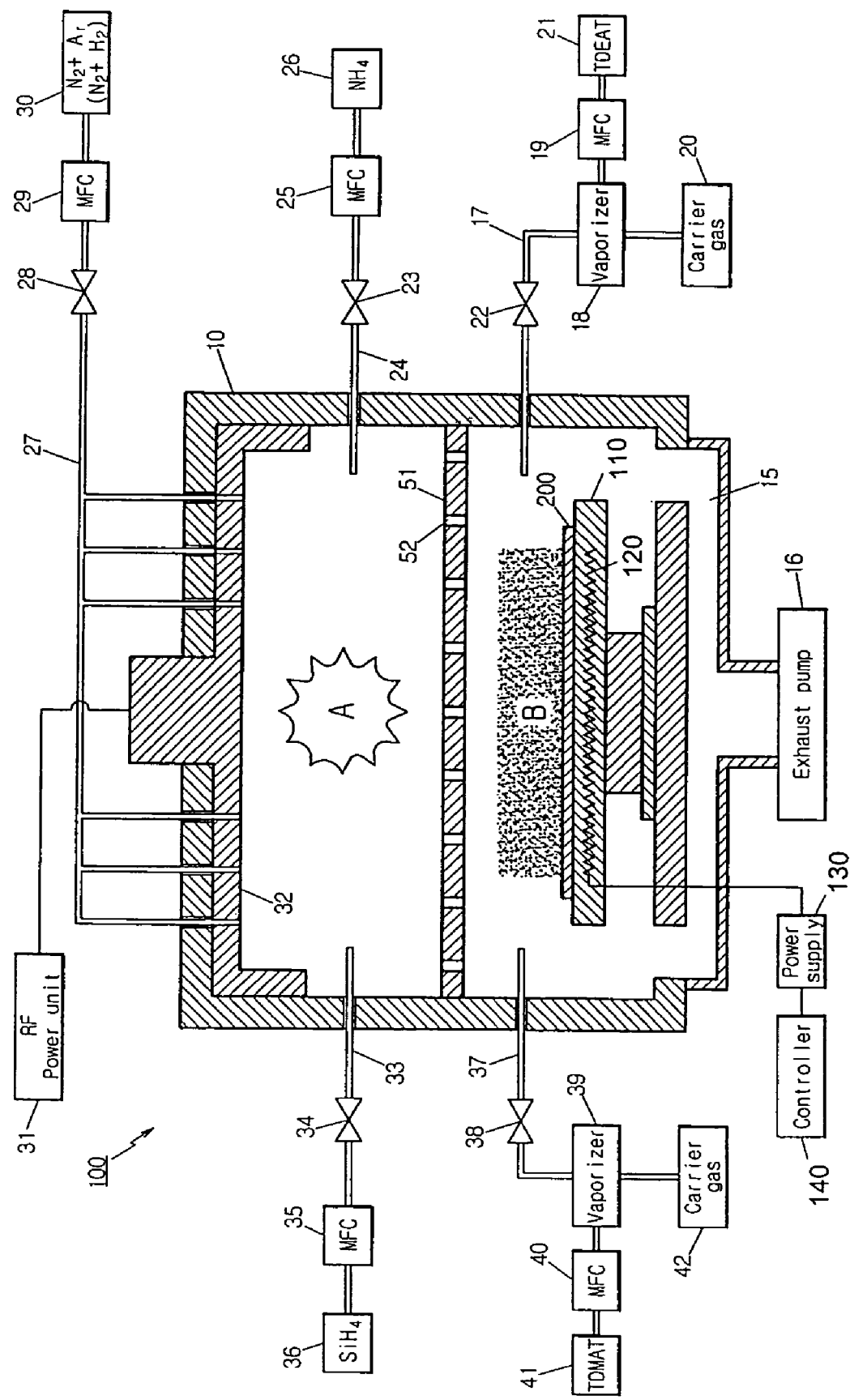
FIG. 4 is a block diagram depicting an example apparatus for forming a single layer barrier metal layer in a semiconductor device.

As shown in the example system of FIG. 4, a semiconductor wafer 200 having the above structure is prepared, and then transported into and loaded in an apparatus 100 for forming a barrier metal layer. Then, a series of process steps are carried out to form a barrier metal layer on the semiconductor wafer 200.

Referring in detail to FIG. 4, the apparatus 100 for forming a barrier metal layer comprises a chamber 10 for defining a process space and having a stage 110 in the process space so that the semiconductor wafer 200 is seated on the platform or stage 110, a partition 51 for dividing the process space within the chamber 10 into upper and lower sections A and B, reactant gas injectors 36 and 26 for injecting reactant gas such as $SiH_4$ and $NH_3$ into the upper section A of the chamber 10, precursor injectors 21 and 41 for injecting precursor such as Tetra Di Ethyl Amido Titanium (TDEAT) or Tetra Di Methyl Amido Titanium (TDMAT) into the lower section B of the chamber 10, plasma-based gas injectors 30 for injecting plasma-based gas such as $N_2+Ar$ and $N_2+H_2$ into the upper section A of the chamber 10 and an RF antenna 32 for supplying RF power into the upper section A of the chamber 10 to transform reactant gas into plasma. An RF power unit 31 is provided for example above the chamber 10, and may be electrically connected with the RF antenna 32 to function as an RF power source of the RF antenna 32. An exhaust pump 16 is provided under the chamber 10, and is coupled to the chamber 10 via an exhaust line to exhaust gas out of the chamber 10.

The partition 51 is provided with a number of through holes 52 for allowing selective passage of reactant gas that is transformed into plasma into the lower section B. The platform or stage 110 is internally mounted with a heating line 120 for heating the semiconductor wafer 200. In this manner, the heating line 120 can provide a suitable temperature to the semiconductor wafer 200 via cooperation of a power supply 130 and a controller 140.

Vaporizers 18 and 39 are also provided respectively between the precursor injectors 21 and 41 and the chamber 10 so that precursor discharged from the precursor injectors 21 and 41 can be vaporized by the vaporizers 18 and 19 before conveyance into the lower section B of the chamber 10.

The vaporizers 18 and 39 are connected respectively with carrier gas injectors 20 and 42, which inject carrier gas into the vaporizers 18 and 39 to promote mobility of vaporized precursor.

As is also shown in FIG. 4, the apparatus 100 may also include MFCs 19, 25, 29, 35 and 40 and valves 22, 23, 28, 34 and 38. The MFCs 19, 25, 29, 35 and 40 are connected respectively with the precursor injector 21, the reactant gas injector 26, the plasma-based gas injector 30, the reactant gas injector 36, and the precursor injector 41 to properly regulate the flow rate and quantity of plasma-based gas, reactant gas and precursor that are discharged from the injectors. The valves 22, 23, 28, 34 and 38 are arranged respectively in portions of a precursor input pipe 17, an reactant gas input pipe 24, a plasma-based gas input pipe 27, an reactant gas input pipe 33 and a precursor input pipe 37, and opened and closed to selectively regulate flow of precursor, reactant gas and plasma-based gas discharged from corresponding injectors.

In the example apparatus 100, upon completion of establishing a series of process conditions, the plasma-based gas injector 30 and the reactant gas injectors 26 and 36 inject plasma-based gas such as $N_2+Ar$ and $N_2+H_2$ and reactant gas such as SiH4 and NH3 into the upper section A of the chamber 10, and the precursor injectors 21 and 41 inject precursor such as TDEAT and TDMAT into the lower section B of the chamber 10.

When gas and precursor are injected into the chamber 10, the RF power unit 31 supplies RF power toward the RF antenna 32 to form an RF electric field in the upper section A of the chamber 10 so that plasma-based gas such as $N_2+Ar$ and $N_2+H_2$ and the reactant gas can be rapidly transformed into plasma. In this case, reactant gas conveyed into the upper section A and transformed into plasma flows into the lower section B of the chamber 10, and then reacts with precursor that is conveyed into the lower section B for deposition on a desired region of the semiconductor wafer 200 seated on the stage 110.

As described above, the partition 51 is perforated with the through holes 52 for allowing selective passage of reactant gas that is transformed into plasma toward the lower section B in order to minimize plasma damage to the semiconductor wafer 200.

Figure 5:
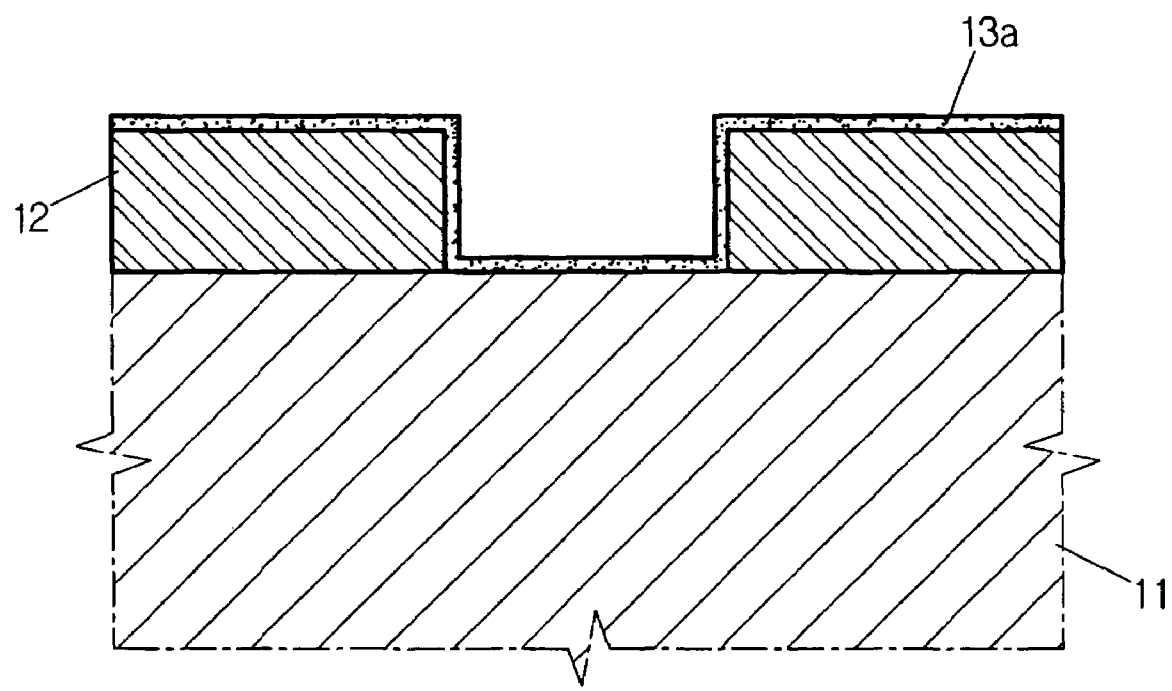

As a result, upon completion of the above processes, as shown in FIG. 5, a single TiSiN film 13a is stably formed on the semiconductor substrate 11, covering the area predetermined as a contact.

In contrast to known structures, the single TiSiN film 13a has a single layer structure, which can prevent unnecessary reduction in the sectional area of a wiring layer to readily minimize the wire resistance of a final wire layer.

According to the above-described example process, the barrier metal layer may be embodied in the single layer structure to readily improve the productivity and quality of a final semiconductor device over a predetermined level.

The TiSiN film 13a may be grown through reaction of reactant gas such as $SiH_4$ and $NH_3$ and precursor such as TDEAT and TDMAT, while plasma processing is carried out using plasma-based gas such as $N_2+Ar$ and $N_2+H_2$ so that impurities such as CH-based impurities contained in the TiSiN film can be readily removed through reaction of plasma-based gas such as $N_2+Ar$ and $N_2+H_2$. As a result, the resulting TiSiN film 13a can maintain a desired or optimum specific resistance value.

Figure 6:
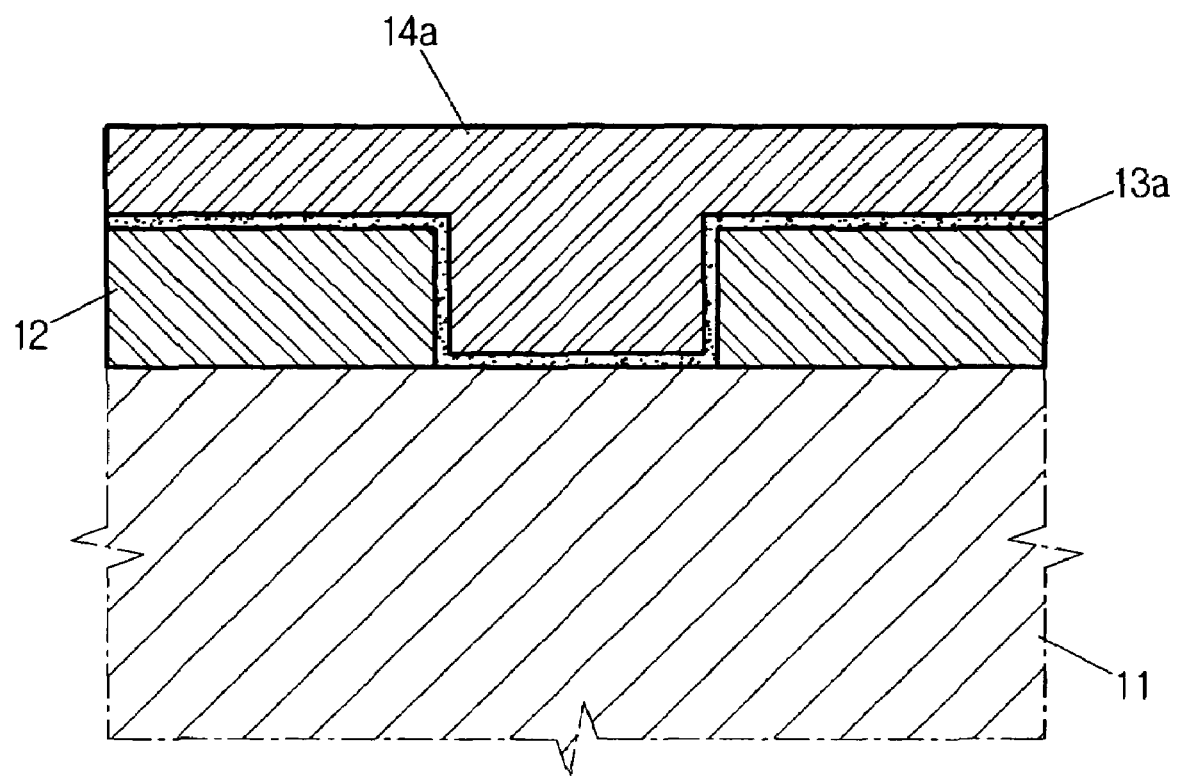

The example methods described herein may form a contact metal base layer 14a on the TiSiN film 13a, as shown in FIG. 6, and may form a final TiSiN metal layer 13 and a contact metal layer 14 through polishing, as shown in FIG. 7, to complete the process of forming a barrier metal layer.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method for forming a barrier metal layer in a semiconductor device, comprising:

forming an interlayer insulating layer on a front face of a semiconductor substrate having a contact area;

patterning the interlayer insulating layer to open the contact area;

placing the substrate in a chamber having a process space divided into a first section and a second section by a partition, wherein the partition includes a plurality of through holes;

injecting reactant gas into the first section and precursor into the second section;

transforming the reactant gas into plasma gas; and causing the plasma gas to react with the precursor to form a single TiSiN film covering the contact area wherein the holes allow selective passage of reactant gas that is transformed into plasma toward the second section in order to minimize plasma damage and unnecessary impurities to the semiconductor substrate.

2. A method as defined in claim 1, wherein the substrate is placed in the second section of the chamber.

3. A method as defined in claim 1, wherein the precursor is vaporized before being injected.

4. A method as defined in claim 1, wherein plasma-based gas is further injected into the first section.

5. A method as defined in claim 4, wherein the plasma-based gas is $N_2+Ar$ or $N_2+H_2$.

6. A method as defined in claim 1, wherein the precursor is one of Tetra Di-Ethyl Amido Titanium (TDEAT) and Tetra Di-Methyl Amido Titanium (TDMAT).

7. A method as defined in claim 1, wherein the reactant gas comprises $SiH_4$ and $NH_3$.

* * * * *